United States Patent [19]

Endo et al.

[11] Patent Number: 4,495,421
[45] Date of Patent: Jan. 22, 1985

[54] OPTICAL POWER SUPPLY SWITCHING APPARATUS

[75] Inventors: Hiroshi Endo; Masazumi Sone; Iwao Imai; Hideo Kasuya, all of Yokosuka, Japan

[73] Assignee: Nissan Motor Company, Limited, Yokohama, Japan

[21] Appl. No.: 363,149

[22] Filed: Mar. 29, 1982

[30] Foreign Application Priority Data

Apr. 7, 1981 [JP] Japan ................ 56-51259

[51] Int. Cl.³ .................. G02B 27/00; H01J 40/14
[52] U.S. Cl. ................................ 250/551; 307/311
[58] Field of Search ............... 250/551, 227; 307/311; 405/602

[56] References Cited

U.S. PATENT DOCUMENTS

| 2,506,672 | 5/1950 | Kell et al. ................ 250/551 |
| 3,486,029 | 12/1969 | Barrett et al. ............. 250/551 |
| 3,610,938 | 10/1971 | Cook et al. ................ 250/551 |
| 4,456,903 | 6/1984 | Kishi et al. . | |

FOREIGN PATENT DOCUMENTS

| 2122983 | 11/1972 | Fed. Rep. of Germany . |
| 2163495 | 7/1973 | Fed. Rep. of Germany . |
| 2348900 | 4/1975 | Fed. Rep. of Germany . |
| 0006440 | 1/1977 | Japan ................ 455/602 |
| 1214817 | 12/1970 | United Kingdom . |
| 1238029 | 7/1971 | United Kingdom . |
| 1246412 | 9/1971 | United Kingdom . |
| 1269502 | 4/1972 | United Kingdom . |
| 1285884 | 8/1972 | United Kingdom . |

*Primary Examiner*—Edward P. Westin
*Attorney, Agent, or Firm*—Schwartz, Jeffery, Schwaab, Mack, Blumenthal & Koch

[57] ABSTRACT

An optical power supply switching apparatus by which a battery power can be connected to or disconnected from at least one electric appliance provided for an automotive vehicle without generating electromagnetic noise or electromagnetic interference between the electric appliance and other audio equipment. The optical power supply switching apparatus according to the present invention comprises at least one light-emitting element, one optical fiber, at least one photoelectric transducer, at least one semiconductor contactless switching element, and a plurality of optical directional-couplers and optical filters where necessary, in addition to a special low-impedance coaxial power distribution line.

9 Claims, 4 Drawing Figures

OPTICAL POWER SUPPLY SWITCHING APPARATUS

BACKGROUND OF THE INVENTION

1. Field of the Invention

The present invention relates generally to an optical power supply switching apparatus by which any number of electric appliances can be turned on or off through the medium of optical signals whenever power switches disposed at a position remote from the electric appliance are manually turned on or off, and more specifically to an optical switching apparatus for reducing electromagnetic interference between the controlled electric appliances and other audio equipment or electronic appliances.

2. Description of the Prior Art

The background of the present invention will be explained hereinbelow with respect to its application to an apparatus used in an automotive vehicle by way of example.

An automotive vehicle is generally equipped with various electric appliances, each having various electric loads such as motors, solenoids, air-conditioning system elements, etc. These electric appliances are operated or activated when the driver operates a corresponding manual switch in order to supply battery power to these appliances.

In electric appliances such are described above, however, in the case when a large current intermittently passes through the appliance via a power supply line, especially in the case of an electric appliance which includes inductive loads such as solenoids or motors, resonance phenomena due to the inductive impedance and stray capacitance within the appliance induce a high-frequency oscillation, thus generating high-frequency intermittent arcing across the contacts of relays. As a result, high-frequency, high-amplitude noise signals flow through the power supply line, resulting in electromagnetic noise which can be amplified through a car radio.

A more detailed description of the prior-art power supply switching apparatus will be described with reference to the attached drawing under DETAILED DESCRIPTION OF THE PREFERRED EMBODIMENTS.

SUMMARY OF THE INVENTION

With these problems in mind therefore, it is the primary object of the present invention to provide an optical power supply swtiching apparatus which can turn electric appliances on or off without generating electromagnetic noise, that is, without transmitting noise to audio equipment such as a car radio.

To achieve the above mentioned object, the optical power supply switching apparatus according to the present invention comprises at least one light-emitting element, one optical fiber, at least one photoelectric transducer, at least one semiconductor contactless switching element, and a plurality of optical directional-couplers and optical filters when necessary, in addition to manual switches and a special low impedance coaxial power supply line.

BRIEF DESCRIPTION OF THE DRAWINGS

The features and advantages of the optical power supply switching on-or-off apparatus according to the present invention over the prior art apparatus will be more clearly appreciated from the following description of the preferred embodiments of the invention taken in conjunction with the accompanying drawings in which like reference numerals designate the same or similar elements or sections throughout the figures and in which.

DETAILED DESCRIPTION OF THE PREFERRED EMBODIMENTS

To facilitate understanding of the present invention, brief reference will be made of a representative prior-art power supply switching apparatus, with reference to the attached drawings.

Figure 1:
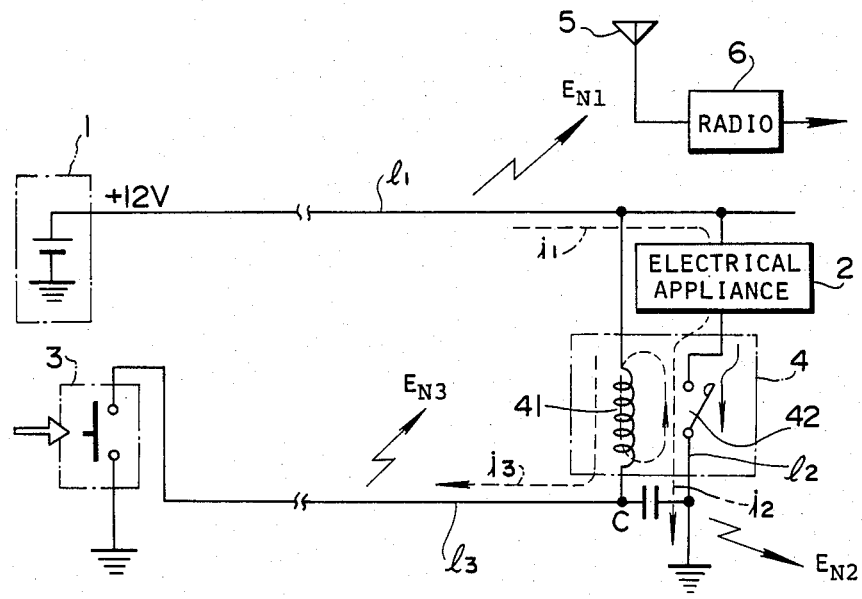
FIG. 1 is a schematic diagram of a representative prior-art power supply switching apparatus.

Conventionally, an apparatus such as that shown in FIG. 1 has been employed in an automotive vehicle to turn electric appliances on and off from a remote manual switch disposed near the driver's seat.

In the figure, the reference numeral 1 denotes a 12-volt battery mounted on an automotive vehicle. The reference numeral 2 denotes an electric appliance including various electric loads such as a motor, solenoid, air-conditioning heater, etc., which is operated or activated when power supply voltage from the battery 1 is supplied thereto. The reference numeral 3 denotes a manual switch. When this manual switch 3 is closed by the driver, a coil 41 of a relay 4 is energized to close the relay contact 42 to supply the power supply voltage to the electric appliance 2. The symbol $l_1$ designates a power supply line connecting the positive terminal of the battery 1 to one terminal of the electric appliance 2. The symbol $l_2$ designates a ground line for connecting the other terminal of the electric appliance 2 to ground via the relay contact 42. The symbol $l_3$ designates a relay energizing line connecting one terminal of the manual switch 3 to one terminal of the relay coil 41 of the relay 4. Further, the symbol C denotes a condensor for shorting high-frequency high-voltage signals generated when the relay 4 is closed or opened directly to the ground in order to protect the contacts of the manual switch 3 and the relay 4.

In the prior-art power supply switching apparatus, when the driver closes the manual switch 3, current flows through the relay coil 41 to energize the coil and therefore the relay contact 42 is closed to pass current through the electric appliance 2.

In a conventional apparatus such as described above, however, when current flow through the power supply line $l_1$ and the ground line $l_2$ is abruptly started or cut off when the relay contact 42 is closed or opened, especially when the appliance 2 includes inductive loads such as solenoids or motors, resonance phenomena due to the inductive impedance and stray capacitance of the load generate high-frequency, high-voltage oscillations which induce intermittent arcing across the contacts of the relay 4. Therefore, a high-frequency, high-amplitude noise current $i_2$ (possibly several amperes) flows through the ground line $l_2$, and as a result, an electromagnetic noise signal $E_{N2}$ is transmitted by the line $l_2$. Additionally, the mutual inductive coupling within the relay coil 41 and electrostatic coupling within the relay coil 41 or between the lines $l_1$, $l_2$, and $l_3$ within the apparatus induces the other noise currents $i_1$ and $i_3$ through the lines $l_1$ and $l_3$; as a result, electromagnetic noise signals $EN_1$ and $EN_3$ may be transmitted from the lines $l_2$ and $l_3$, respectively.

Therefore, these noise signals $EN_1$, $EN_2$, and $EN_3$ transmitted from the apparatus will be amplified through audio equipment provided for the automotive vehicle, such as a car radio, thus producing undesirable audible noise.

In view of the above description, reference is now made to the optical power supply switching apparatus according to the present invention with reference to the attached drawings.

Figure 2:
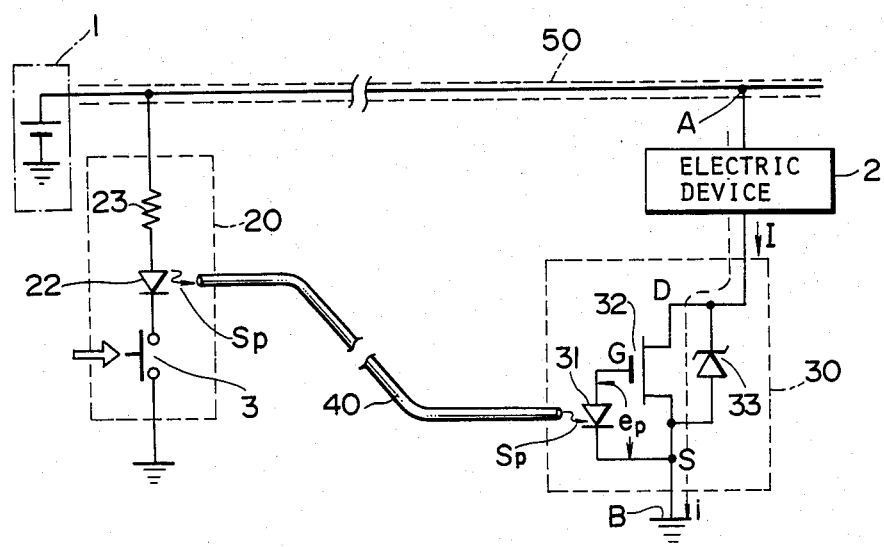
FIG. 2 is a schematic diagram of a first embodiment of the optical power supply switching apparatus according to the present invention.

FIG. 2 shows a first embodiment according to the present invention, in which a single electric appliance is turned on or off by a single manual switch. First, the configuration thereof will be described.

The apparatus comprises an optical signal generating switch 20 for generating an optical signal $S_p$ when a manual switch 3 is turned on, an optical fiber 40 for conducting this optical signal $S_p$, a switching unit 30 for supplying electrical power to the electric appliance 2 in response to the optical signal $S_p$ received via the optical fiber 40, and a power supply line 50, conducted between the battery 1 and the appliance 2, designed for low impedance against high-frequency signals.

The optical signal generating switch 20 includes a manual switch 3, a semiconductor light-emitting element 22 and a resistor 23, which are all connected in series with the battery 1.

The switching unit 30 includes a photoelectric transducer 31 for transducing the optical signal $S_p$ into the corresponding electric signal $e_p$, a field effect transistor 32 (hereinafter referred to as FET), in which the connection between the drain terminal D connected to the appliance 2 and the source terminal S connected to ground is turned on or off in response to the transduced signal $e_p$, and a surge voltage absorbing element 33 connected between the drain terminal D and the source terminal S of the FET 32. In the embodiment shown in FIG. 2, the FET 32 is used in the switching unit 30 by way of example; however, it is possible to use other semiconductor contactless elements such as a silicon control rectifier, bipolar transistor, etc., in place of the FET. Normally, this switching unit 30 will be mounted on the vehicle near the electric appliance 2, for instance, within the engine compartment, in the trunk, or under the rear parcel shelf.

Next, the operation of the embodiment of FIG. 2 will be described.

When the driver turns on the manual switch 3, current flows from the battery 1, through the resistor 23 and the semiconductor light-emitting element 22, such as a light-emitting diode, to ground, so that an optical signal $S_p$ having a specific wavelength $\lambda$ will be produced by the element 22. This optical signal $S_p$ is conducted by the optical fiber 40 to the photoelectric transducer 31 of the switching unit 30, such as a phototransistor, photodiode, photovoltaic cell, etc., so that an electromotive force will be generated therefrom due to photoelectric effect, that is, the optical signal $S_p$ is transduced into a corresponding electric voltage signal $e_p$. When this voltage signal $e_p$ developed across the photoelectric transducer 31 is applied across the gate terminal G and the source terminal S of the FET 32, the gate terminal G closes to connect the drain terminal D and the source terminal S, so that the electric appliance 2 is turned on by the FET 32. That is to say, it is possible to turn the appliance 2 on or off by way of an optical signal in response to the manual switch 21. In this embodiment, a surge voltage absorbing element 33, such as a constant voltage diode, is connected between the drain terminal D and the source terminal S of the FET 32, in order to protect the FET 32 from high-frequency high-voltage surge signals generated when the electric appliance 2 is turned on or off.

In contrast to the conventional apparatus shown in FIG. 1, since there are no mechanical contacts, such as would be included in a relay, within the switching unit 30, even if the electric appliance 2 includes an inductive load, it is possible to prevent generation of the high-frequency noise current 1, that is, the spurious discharge phenomena. However, in the case where some mechanical contacts, such as thermo-switches, are provided within the appliance 2, whenever the appliance 2 itself is turned on or off, spurious discharge phenomena will be produced between the mechanical contacts within the appliance 2, with the result that a high-frequency noise current i will flow between the point of connection with the power supply line 50 (point A) and ground (point B). In order to absorb or eliminate as much as possible the noise current i flowing through the power supply line 50, a coaxial cable or a low-impedance wire is used as the power line 50, as shown in FIG. 3.

The low-impedance coaxial cable comprises a square-duct-shaped outer conductive member 72 which is made of a thin aluminum plate and is grounded, a conductive member 71 at the center of the square-duct-shaped outer conductive member 72 and a dielectric material 73 such as a synthetic resin or porcelain segregating the outer conductive member and the central conductive member. The low-impedance coaxial cable is used as the power supply line 50 with the central conductive member connected between the battery 1 and the electric appliance 2 and with the outer conductive member grounded.

Since the coaxial cable acts as a condenser, it is possible to effectively damp high-frequency noise signals flowing through the power supply line to ground, that is, to improve the absorption of the noise current i.

Figure 3:
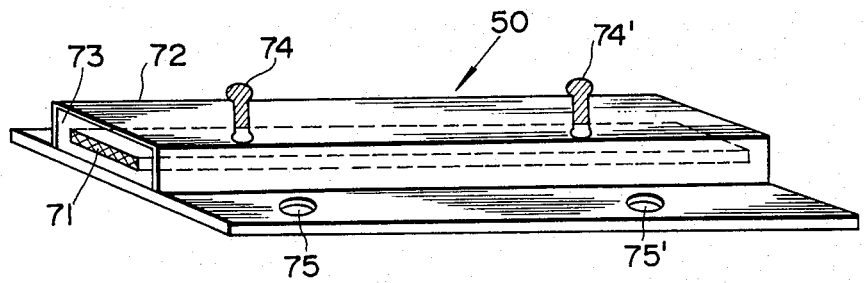
FIG. 3 is an enlarged perspective view of a low-impedance power supply line used with the first embodiment of the optical power supply switching apparatus according to the present invention shown in FIG. 2.

Furthermore, in FIG. 3, the reference numerals 74 and 74' denote connection terminals, and the reference numerals 75 and 75' denote screw holes for mounting the power line onto the vehicle body.

As explained above, since a low-impedance coaxial cable is used for the power supply line 50 and since the electric signal generated by the manual switch 3 is transmitted to the switching unit 30 via the optical fiber 40 as an optical signal $S_p$, it is possible to effectively prevent induction of the noise current i. Furthermore, by keeping the length of the wire connected between points A and B as short as possible and by using a shielded cable therefor, it is possible to suppress electromagnetic noise signals to a minimum.

Figure 4:
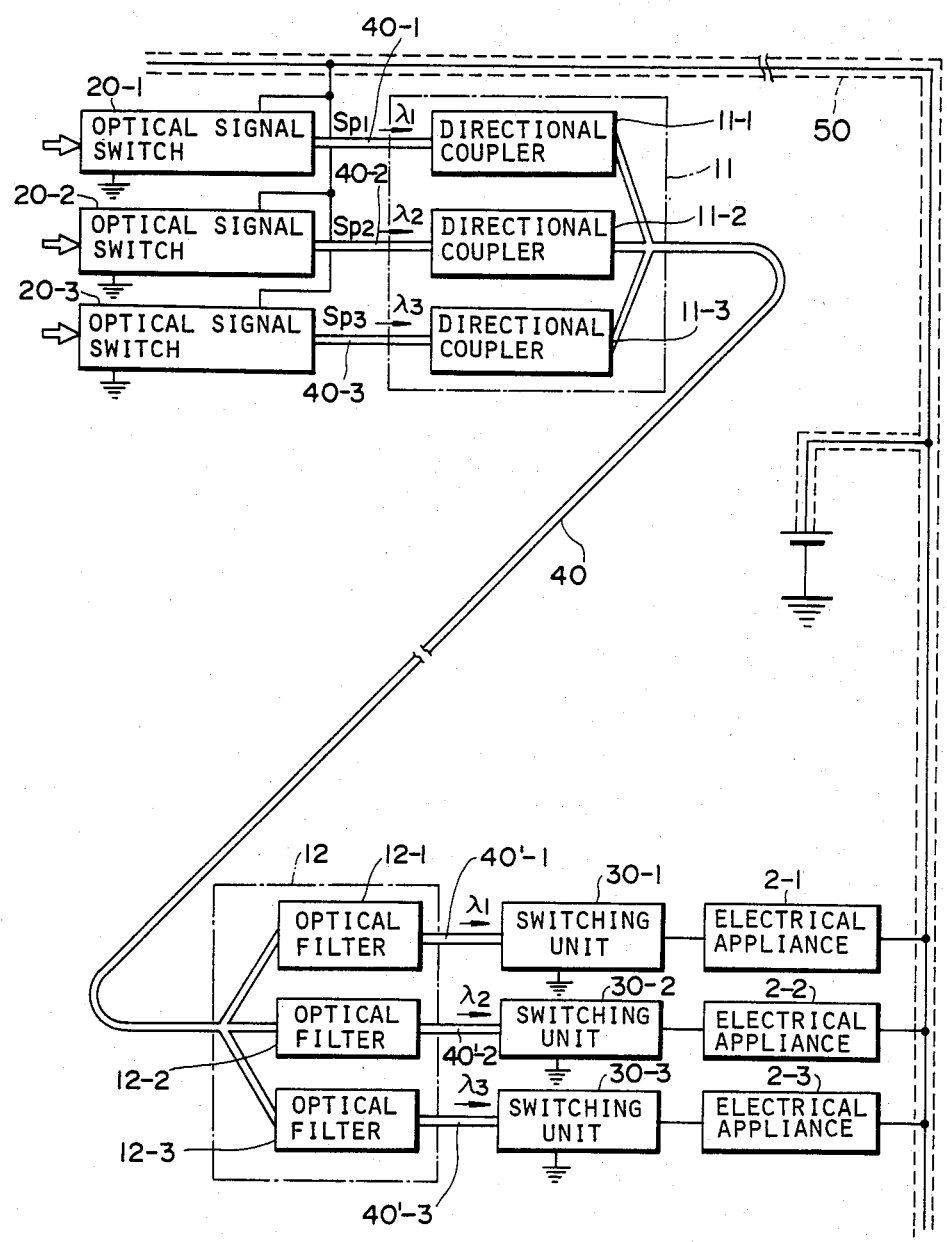
FIG. 4 is a schematic diagram of a second embodiment of the optical power supply switching apparatus according to the present invention.

FIG. 4 shows a second embodiment of the optical power supply switching apparatus according to the present invention, in which three electric appliances are turned on or off, through the medium of optical signals, from three separate manual switches.

When the manual switches (not shown in FIG. 4) mounted on an instrument panel and connected to respective optical signal switches 20-1, 20-2 and 20-3 are turned on by the driver, respective optical signals $S_{p1}$, $S_{p2}$ and $S_{p3}$ having respective specific wavelengths $\lambda_1$, $\lambda_2$ and $\lambda_3$ are produced by respective optical signal switches 20-1, 20-2 and 20-3, and next are conducted to a light collector 11 through respective optical fibers 40-1, 40-2 and 40-3. The optical signals $S_{p1}$, $S_{p2}$ and $S_{p3}$ are collectively introduced into an optical fiber 40 via respective directional coupler 11-1, 11-2 or 11-3 by which the optical signals are selectively directed toward the optical fiber 40 in such a way that all of the optical signals can be conducted together by the fiber 40. The optical signals $S_{p1}$, $S_{p2}$ and $S_{p3}$ are transmitted via the optical fiber 40 to various portions in the vehicle, for instance, engine compartment, trunk, rear parcel shelf, etc. and there into a light divider 12. In this light divider 12, the composite optical signal is separated by three optical wavelength filters 12-1, 12-2 and 12-3. The optical filter 12-1 can pass only light of wavelength $\lambda_1$; the optical filter 12-2 can pass only light of wavelength $\lambda_2$; the optical filter 12-3 can pass only light of wavelength $\lambda_3$. The divided rays are further conducted to respective switching units 30-1, 30-2 and 30-3 disposed near respective electric appliances 2-1, 2-2 and 2-3 via respective optical fibers 40'-1, 40'-2 or 40'-3. In response to these optical signals $S_{p1}$, $S_{p2}$ and $S_{p3}$, the respective switch units 30-1, 30-2 and 30-3, which each include a photoelectric transducer and a semiconductor contactless switching element, are turned on or off as described in the first embodiment. That is to say, the switching of the electric appliances 2-1, 2-2 and 2-3 is controlled through the medium of three optical signals with the shortest possible electric line or shielded cable between the power supply line 50 and the respective switching units. Furthermore, as described above with reference to FIG. 2, it is desirable to use a low-impedance cable as the power supply line. In the second embodiment of FIG. 4, a plurality of electric appliances can be turned on or off, while effectively suppressing undesirable electromagnetic noise.

As described above, in the optical power supply switching apparatus for electric appliances according to the present invention, since (1) the power supply line is of low impedance, (2) the switching of electric appliances or loads is controlled by a switching unit using semiconductor contactless switching elements activated by optical signals, and (3) the optical signals generated by the driver are transmitted to the above-mentioned switching unit via optical fibers, it is possible to reduce electromagnetic noise generated when the appliances are activated, and thus electromagnetic interference with other equipment such as a car radio, radio communication device, electronic equipment, etc., to reduce the size and weight of the apparatus and to reduce the risk of electrical fire due to damage to the power line. Furthermore, in the second embodiment according to the present invention as shown in FIG. 4 by which a plurality of electric appliances are controlled, since a plurality of optical directional couplers and optical wavelength filters are provided in order to transmit optical signals to the respective switch units through a single optical fiber, it is possible to simplify the entire control system, in particular, to reduce the number of optical fibers, thus reducing the manufacturing cost.

It will be understood by those skilled in the art that the foregoing description is in terms of preferred embodiments of the present invention wherein various changes and modifications may be made without departing from the spirit and scope of the invention, as set forth in the appended claims.

What is claimed is:

1. An optical power supply switching apparatus for connecting or disconnecting a power supply to or from at least one electric appliance, which comprises:
 (a) a power supply line for connecting the power supply to the at least one electrical appliance, said power supply line comprising a low impedance coaxial cable;
 (b) at least one manual switch;
 (c) at least one light-emitting element connected in series with the power supply and said manual switch for emitting therefrom at least one optical signal $S_p$ having a specific wavelength when said manual switch is closed;
 (d) one optical fiber, one end of which is disposed near said light-emitting element in such a way that the optical signal $S_p$ emitted from said light-emitting element can be introduced thereinto;
 (e) at least one photoelectric transducer disposed near the other end of said optical fiber in such a way that said transducer can generate a voltage signal $e_p$ when the optical signal $S_p$ is applied thereto through said optical fiber; and
 (f) at least one non-electromechanical switching element responsive to the signal $e_p$ from said photoelectric transducer for connecting the power supply to the electric appliance via said power supply line when said photoelectric transducer generates the voltage signal $e_p$ and for disconnecting the power supply from the electric appliance when said photoelectric transducer does not generate the voltage signal $e_p$;
 whereby the electric appliance is switched on or off through the medium of an optical signal when said manual switch is turned on or off.

2. An optical power supply switching apparatus for connecting or disconnecting a power supply to or from at least one electric appliance as set forth in claim 1, which further comprises:
 (a) a plurality of optical directional-couplers connected between a plurality of said light-emitting elements and said optical fiber for receiving a plurality of the optical signals $S_{p1}$, $S_{p2}$, and $S_{p3}$ having different specific wavelengths $\lambda_1$, $\lambda_2$ and $\lambda_3$ emitted from a plurality of said light-emitting elements and for directing the optical signals toward said optical fiber in such a way that the optical signals can be collected into said optical fiber; and
 (b) a plurality of optical wavelength filters connected between said optical fiber and plurality of said photoelectric transducers for receiving the plurality of the optical signals $S_{p1}$, $S_{p2}$, and $S_{p3}$ having different specific wavelengths $\lambda_1$, $\lambda_2$, and $\lambda_3$ from said optical fiber, for selectively filtering the optical signals into respective independent optical signals having, respectively, the different specific wavelengths $\lambda_1$, $\lambda_2$, and $\lambda_3$ and for applying the respective filtered optical signals to a plurality of said photoelectric transducers, respectively.

3. An optical power supply switching apparatus for connecting or disconnecting a power supply to or from at least one electric appliance as set forth in either claim 1 or 2, wherein said power supply line is a low-impedance coaxial cable comprising:

(a) a square-duct-shaped outer conductive member which is grounded;
(b) a central conductive member within said square-duct-shaped outer conductive member for connecting the power supply to the at least one electric appliance; and
(c) a dielectric material segregating said square-duct-shaped outer conductive member and said central conductive member.

4. An optical power supply switching apparatus as set forth in either claim 1 or 2, wherein said non-electromechanical switching element is a field-effect transistor, the source terminal of which is grounded and the drain terminal of which is connected to the electric appliance, and wherein said photoelectric transducer is connected between the gate terminal and the source terminal of said transistor, whereby the voltage signal $e_p$ from said transducer controls the on-and-off state of said transistor, and thereby the on-and-off state of the electric appliance.

5. An optical power supply switching apparatus for connecting or disconnecting a power supply to or from at least one electric appliance as set forth in claim 4, which further comprises at least one surge voltage absorbing element connected between the drain terminal and the source terminal of said at least one transistor for absorbing surge voltages generated across said transistor.

6. An optical power supply switching apparatus as set forth in claim 1 in combination with a motor vehicle having a passenger compartment with a driver seat, said at least one manual switch being mounted in said passenger compartment in a position where said at least one manual switch is operable by a person sitting in said driver's seat.

7. A optical power supply switching apparatus for connecting or disconnecting a power supply to or from at least one electric appliance as set forth in claim 1, wherein said at least one light-emitting element is at least one light-emitting diode.

8. An optical power supply switching apparatus for connecting or disconnecting a power supply to or from at least one electric appliance as set forth in claim 1, wherein said at least one photoelectric transducer is at least one photodiode.

9. An optical power supply switching on-or-off apparatus for connecting or disconnecting a power supply to or from at least one electric appliance as set forth in claim 5, wherein said at least one surge voltage absorbing element is at least one constant-voltage diode.

* * * * *